United States Patent
Fan et al.

(10) Patent No.: US 12,173,862 B2
(45) Date of Patent: Dec. 24, 2024

(54) LIGHT SOURCE MODULE AND LIGHTING DEVICE COMPRISING THE LIGHT SOURCE MODULE

(71) Applicants: OPPLE LIGHTING CO., LTD., Shanghai (CN); SUZHOU OPPLE LIGHTING CO., LTD., Suzhou (CN)

(72) Inventors: Xiaoming Fan, Suzhou (CN); Zhixian Zhou, Suzhou (CN)

(73) Assignees: OPPLE LIGHTING CO., LTD., Shanghai (CN); SUZHOU OPPLE LIGHTING CO., LTD., Jiangsu (CN)

(*) Notice: Subject to any disclaimer, the term of this patent is extended or adjusted under 35 U.S.C. 154(b) by 0 days.

(21) Appl. No.: 18/202,259

(22) Filed: May 25, 2023

(65) Prior Publication Data

US 2023/0296213 A1    Sep. 21, 2023

Related U.S. Application Data

(63) Continuation of application No. PCT/CN2021/130390, filed on Nov. 12, 2021.

(30) Foreign Application Priority Data

Nov. 26, 2020   (CN) .......................... 202011342042.5

(51) Int. Cl.
*F21S 6/00*         (2006.01)
*F21Y 113/10*       (2016.01)
(Continued)

(52) U.S. Cl.
CPC ............ *F21S 6/003* (2013.01); *H01L 33/504* (2013.01); *F21Y 2113/10* (2016.08); *F21Y 2115/10* (2016.08)

(58) Field of Classification Search
CPC ... F21S 6/003; F21Y 2113/10; F21Y 2115/10; H01L 33/504
See application file for complete search history.

(56) References Cited

U.S. PATENT DOCUMENTS

2020/0176646 A1   6/2020   Li et al.
2020/0303598 A1   9/2020   Kim et al.

FOREIGN PATENT DOCUMENTS

CN    107623064 A    1/2018
CN    111081852 A    4/2020
(Continued)

OTHER PUBLICATIONS

International Search Report of PCT Application No. PCT/CN2021/130390 dated Feb. 10, 2022 with English translation.

*Primary Examiner* — Erin Kryukova
(74) *Attorney, Agent, or Firm* — Arch & Lake LLP

(57) ABSTRACT

A light source module includes a blue light generation portion, a cyan light generation portion, a yellow-green light generation portion and a red light generation portion. The red light generation portion includes a first additional light emitter and a second additional light emitter, the first additional light emitter emits a light having a main emission peak in the red light wave band, the second additional light emitter emits a light having a secondary emission peak in the red light wave band, and a spectral intensity of the secondary emission peak is 30.0%-80.0% of a spectral intensity of the main emission peak. An emitted light of the light source module is a white light with a color temperature of 3000K~6000K, and in a CIE1931 color space, a distance between the emitted light and a blackbody locus BBL is duv=−0.007-0.007.

15 Claims, 4 Drawing Sheets

(51) Int. Cl.
*F21Y 115/10* (2016.01)
*H01L 33/50* (2010.01)

(56) References Cited

FOREIGN PATENT DOCUMENTS

| | | | | |
|---|---|---|---|---|
| CN | 112420902 | A | 2/2021 | |
| CN | 214625083 | U | 11/2021 | |
| EP | 3206240 | A1 * | 8/2017 | ......... C09K 11/0883 |
| KR | 20180015519 | A * | 2/2018 | |
| KR | 102166276 | B1 * | 10/2020 | |
| WO | WO-2012077448 | A1 * | 6/2012 | ......... C09K 11/7721 |
| WO | WO-2017043851 | A1 * | 3/2017 | ........... H01L 33/504 |

* cited by examiner embodiment 1 embodiment 1 embodiment 2 embodiment 2 embodiment 3 embodiment 3

LIGHT SOURCE MODULE AND LIGHTING DEVICE COMPRISING THE LIGHT SOURCE MODULE

CROSS-REFERENCE TO RELATED APPLICATIONS

This application is based upon and claims the priority of PCT patent application No. PCT/CN2021/130390 filed on Nov. 12, 2021 which claims priority to the Chinese patent application No. 202011342042.5, filed on Nov. 26, 2020, the entire contents of which are hereby incorporated by reference herein for all purposes.

TECHNICAL FIELD

The present disclosure relates to a light source module and a lighting device comprising the light source module.

BACKGROUND

As the information society continues to grow, the incidence of myopia is also showing a rapid development trend. Ten years ago, the number of myopes in countries such as Japan, South Korea and Singapore was much higher than that in China. However, a joint investigation by the Ministry of Health and the Ministry of Education in 2018 showed that the number of students having myopia in China has ranked first in the world. Myopia is caused by a change in the axis of the eye, so that the parallel light rays from the outside, after entering the eyeball, cannot be focused on the retina but fall in front of the retina, and thus a clear image cannot be obtained. At present, myopia control is mainly carried out through medical means such as wearing frame glasses and implementing orthokeratology, which has brought great inconvenience and trouble to the daily life of children and adolescents. The means of preventing myopia is also relatively simple, that is, outdoor activity. About 2 hours of outdoor activity per day has been proven to be effective in preventing the incidence of myopia. However, due to the heavy homework burden of adolescents, it is not very feasible to carry out a long-time outdoor activity for adolescents.

Primate studies have found that long-wavelength red light illumination may prevent myopia or delay the occurrence of myopia by creating signals related to myopic defocus to prevent axial elongation caused by form deprivation or hyperopic defocus. Studies of long-wavelength red light have found that the long-wavelength red light can increase the content of dopamine in the retina and inhibit the increase in eye axis caused by myopia. In addition, the red light promotes the blood circulation of the choroid and improves the blood supply to the retina and sclera. In a study of 264 myopic children, it was found that repeated low-intensity red light therapy for 3 months had no retinal damage and could stop the progression of myopia in school-age children.

SUMMARY

The present disclosure provides a light source module and a lighting device.

The present disclosure provides a light source module. The light source module may include: a blue light generation portion emitting a first color light with a peak wavelength in a blue light wave band of 430~470 nm; a cyan light generation portion emitting a second color light with a peak wavelength in a cyan light wave band of 470~510 nm; a yellow-green light generation portion emitting a third color light with a peak wavelength in a yellow-green light wave band of 510~600 nm; and a red light generation portion emitting a fourth color light with a peak wavelength in a red light wave band of 600~780 nm.

The red light generation portion may include a first additional light emitter and a second additional light emitter, the first additional light emitter is configured to receive a part of light emitted by the blue light generation portion and convert the part of light into a light with a peak wavelength in 630~690 nm to form a main emission peak in the red light wave band, the second additional light emitter is configured to receive a part of light emitted by the blue light generation portion and convert the part of light into a light with a peak wavelength in 610~640 nm to form a secondary emission peak in the red light wave band, and a spectral intensity of the secondary emission peak is 30.0%~80.0% of a spectral intensity of the main emission peak; and the first color light, the second color light, the third color light and the fourth color light are mixed to form an emitted light of the light source module, the emitted light is a white light with a color temperature of 3000K~6000K, and in a CIE1931 color space, a distance between the emitted light and a blackbody locus BBL is duv=−0.007~0.007.

The present disclosure also provides a lighting device that may include the light source module as described above.

It is to be understood that the foregoing general description and the following detailed description are exemplary and explanatory only and are not restrictive of the disclosure.

DETAILED DESCRIPTION

A light source module and a lighting device provided by the present disclosure will be further described in detail below with reference to the accompanying drawings and some examples of the present disclosure.

The white LEDs on the market have not yet carried out professional spectral design for relieving visual fatigue, preventing myopia and delaying the development of myopia. The studies give us an insight into whether the effect of avoiding myopia can be obtained by providing a special lighting source combining with the above-mentioned research results.

The common white LEDs on the market produce white light by RGB mixing. A blue light chip emits blue light to excite green fluorescent powder and red fluorescent powder to emit green light and red light, and then the red light, the green light and the blue light are mixed to form the white light. Studies have found that long-wavelength red light illumination may prevent myopia or delay the occurrence of myopia by creating signals related to myopic defocus to prevent axial elongation caused by form deprivation or hyperopic defocus. Studies of long-wavelength red light have found that the long-wavelength red light can increase the content of dopamine in the retina and inhibit the increase in eye axis caused by myopia. In addition, the red light promotes the blood circulation of the choroid and improves the blood supply to the retina and sclera. Therefore, the present disclosure provides a technical solution of increasing the energy of light emitted by the light source module L1 in the 630~690 nm wave band, that is, adding a red fluorescent powder with a peak wavelength in the wave band of 630~690 nm in addition to a conventional red fluorescent powder. In addition, studies have shown that adolescents are most sensitive to energy in the blue light wave band of 415~465 nm, they should try to avoid prolonged (especially at night) exposure to blue light with high energy, and the prolonged exposure to blue light with high energy may lead to the death of the retinal epithelial cells, which is detrimental to visual health. Therefore, a cyan light generation portion is also included in the light source module L1 of the present disclosure, which replaces a part of the blue light energy with the energy in the cyan light wave band, reduces the proportion of the blue light in the light emitted by the light source module L1, and achieves a better effect of protecting eyesight.

Figure 1:
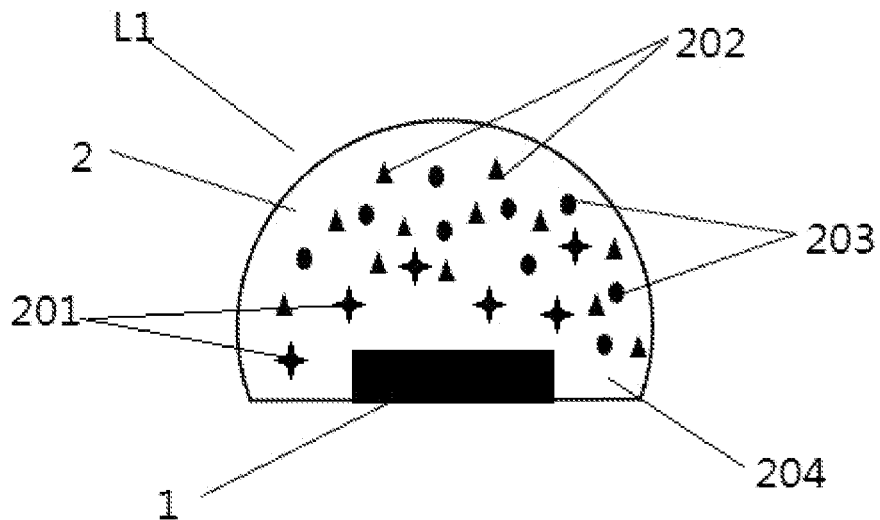
FIG. 1 is a schematic structural view of a light source module according to examples of the present disclosure.

A specific implementation mode of the light source module L1 of the present disclosure is a white light LED package chip in which the white light is obtained by mixing light, as illustrated in FIG. 1, the white light LED package chip for example is an LED chip with a surface-mount package structure or a COB package structure, and the light source module L1 at least includes a blue light generation portion 1 and an encapsulation portion 2 covering the blue light generation portion 1.

The blue light generation portion 1 for example is a blue light LED chip, in which the semiconductor material is directly excited to emit the blue light. The peak wavelength of the light emitted by the blue light generation portion 1 is in the blue light wave band of 430~470 nm, preferably 440~460 nm, and the color of the light emitted by the blue light generation portion 1 is blue. Here, we call the light emitted by the blue light generation portion 1 as the first color light. The LED chip is front-mounted or flip-mounted; the LED chip refers to a single LED chip or multiple LED chips that are connected together in series, in parallel or in a manner of in-series connection and in-parallel connection.

The blue light generation portion 1 is covered by the encapsulation portion 2; and the encapsulation portion 2 further covers a cyan light generation portion 201 emitting a second color light with the peak wavelength in the cyan light wave band of 470~510 nm, preferably 480~500 nm, a yellow-green light generation portion 202 emitting a third color light with the peak wavelength in the yellow-green light wave band of 510~600 nm, and a red light generation portion 203 emitting a fourth color light with the peak wavelength in the red light wave band of 600~780 nm. In the present implementation mode, the cyan light generation portion 201, the yellow-green light generation portion 202 and the red light generation portion 203 are all fluorescent powders, each of which receives a part of the blue light emitted by the blue light generation portion 1 and converts the part of the blue light into light of corresponding color. In other preferred implementation modes, the cyan light generation portion 201 for example is a cyan LED with the peak wavelength in the cyan light wave band of 470~510 nm.

In the present example, the encapsulation portion 2 includes a base material 204, which for example is a transparent silicone or transparent resin, and the transparent resin for example is at least one of epoxy resin and urea resin. A cyan fluorescent powder with the peak wavelength in the cyan light wave band of 470~510 nm is mixed into the base material 204 to serve as the cyan light generation portion 201; a yellow fluorescent powder and/or a green fluorescent powder with the peak wavelength in the yellow-green light wave band of 510~600 nm is mixed into the base material 204 to serve as the yellow-green light generation portion 202, and a red fluorescent powder with the peak wavelength in the red light wave band of 600~780 nm is mixed into the base material 204 to serve as the red light generation portion 203, and the above-mentioned fluorescent powders are evenly mixed and then cover the blue light generation portion 1.

Because color is an intuitive feeling of people, there is no precise definition of the spectral boundaries of respective colors. For the convenience of expression, we define the color wave bands on our own in the present disclosure; more specifically, the blue light wave band in the present disclosure is 430~470 nm, the cyan light wave band in the present disclosure is 470~510 nm, the yellow-green light wave band in the present disclosure is 510~600 nm, and the red light wave band in the present disclosure is 600~780 nm. Each of the above-mentioned cyan fluorescent powder, yellow fluorescent powder, green fluorescent powder, and red fluorescent powder is a single kind of fluorescent powder or a mixture of several kinds of fluorescent powders; the fluorescent powder is considered as the fluorescent powder of the desired color as long as the peak wavelength of the emitted light of the fluorescent powder is within the desired wave band as we defined above. For example, in the present implementation mode, the cyan light generation portion 201 includes a single kind of fluorescent powder, the yellow-green light generation portion 202 includes two kinds of fluorescent powders and is obtained by mixing at least one green fluorescent powder with the peak wavelength in 510~545 nm and at least one yellow fluorescent powder with the peak wavelength in 510~545 nm. By using two kinds of fluorescent powders with different peak wavelengths, a better color rendering property is provided.

The first color light emitted by the blue light generation portion 1, the second color light emitted by the cyan light generation portion 201, the third color light emitted by the yellow-green light generation portion 202 and the fourth color light emitted by the red light generation portion 203 are mixed to form the emitted light of the light source module L1. The light source module L1 is mainly used as a lighting device, and the emitted light obtained by mixing is the white light with a color temperature of 3000K~6000K, and in a CIE1931 color space, a distance between the emitted light and a blackbody locus BBL is duv=−0.007~0.007, preferably duv=−0.005~0.005.

In order to achieve the purpose of the present disclosure, the solution provided by the present disclosure focuses on increasing the energy proportion in the red light wave band of the emitted light of the light source module L1, especially, increasing the energy proportion in the 630~690 nm wave band. Therefore, in the implementation mode of the present disclosure, the red light generation portion 203 adopts two kinds of fluorescent powders. The red light generation portion 203 includes a first additional light emitter and a second additional light emitter, the first additional light emitter is configured to receive a part of the blue light emitted by the blue light generation portion 1 and convert the part of the blue light into the light with the peak wavelength in 630~690 nm to form a main emission peak in the red light wave band, and the second additional light emitter is configured to receive a part of the blue light emitted by the blue light generation portion 1 and convert the part of the blue light into the light with the peak wavelength in 610~640 nm to form a secondary emission peak in the red light wave band. Each of the first additional light emitter and the second additional light emitter is a red fluorescent powder, and the difference between the first additional light emitter and the second additional light emitter is that the peak wavelengths of lights emitted by the first additional light emitter and the second additional light emitter are different from each other. The second additional light emitter is the red fluorescent powder with the peak wavelength in 610~640 nm, which plays a role same as the red fluorescent powder in the conventional white LED, that is, mainly balances the light color. The first additional light emitter is the red fluorescent powder with the peak wavelength in 630~690 nm, which increases the energy in the 630~690 nm wave band. In order to ensure that the increased red light energy effectively achieves the purpose of the present disclosure, that is, in order to ensure that the energy is mainly concentrated in the desired wave band, the first additional light emitter preferably is a narrow-wave band red fluorescent powder, that is, a half-width of the peak wavelength of the fluorescent powder is not greater than 30.0 nm. Because the main emission peak is formed by the first additional light emitter, the half-width of the main emission peak in the emission spectrum of the light source module L1 is not greater than 30.0 nm. Meanwhile, in order to ensure the energy in the 630~690 nm wave band, the spectral intensity of the secondary emission peak is required to be 30.0~80.0% of the spectral intensity of the main emission peak.

After adding the first additional light emitter to increase the energy in the red light wave band, the proportion of the spectral radiation energy of the light emitted by the red light generation portion 203 in the red light wave band of 600~780 nm to the total radiation energy of the light emitted by the light source module L1 in the visible light wave band of 380~780 nm is greater than or equal to 25.0%, especially, the proportion of the spectral radiation energy of the light emitted by the red light generation portion 203 in the red light wave band of 630~690 nm to the total radiation energy of the light emitted by the light source module L1 in the visible light wave band of 380~780 nm is 15.0%~50.0%.

In addition, studies have shown that adolescents are most sensitive to energy in the blue light wave band of 415~465 nm, and they should try to avoid prolonged (especially at night) exposure to blue light with high energy. Therefore, the light source module L1 provided in the present implementation mode also limits the blue light energy of the light emitted by the light source module L1. The light emitted by the blue light generation portion 1 forms a first peak in the blue light wave band of 430~470 nm, and the spectral intensity of the first peak is 20.0%~100.0% of the spectral intensity of the main emission peak, preferably 30.0~80.0%. The proportion of the spectral radiation energy of the first peak in the blue light wave band of 430~470 nm to the total radiation energy of the light emitted by the light source module L1 in the visible light wave band of 380~780 nm is 15.0%~50.0%, preferably 10.0~30.0%.

The addition of cyan light partially compensates for the reduction of blue light, and the cyan light generation portion 201 is provided in the light source module L1. The light emitted by the cyan light generation portion 201 forms a second peak in the cyan light wave band of 470~510 nm, and the spectral intensity of the second peak is 25.0%~100.0% of the spectral intensity of the main emission peak, preferably 35.0~80.0%. The proportion of the spectral radiation energy of the second peak in the cyan light wave band of 470~510 nm to the total radiation energy of the light emitted by the light source module in the visible light wave band of 380~780 nm is 10.0%~30.0%, preferably 10.0~20.0%.

What has been described above is a preferred implementation mode of the present disclosure; in the examples, the blue light generation portion 1, the cyan light generation portion 201, the yellow-green light generation portion 202, and the red light generation portion 203 have multiple options. The following table 1 provides some options of the LED or fluorescent powder of each light generation portion and its light-emission parameters, and table 2 provides seven examples, and the specific options of the blue light generation portion 1, the cyan light generation portion 201, the yellow-green light generation portion 202, and the red light generation portion 203 in the seven examples.

TABLE 1

| No | Material Name | Type | x | y | Peak (nm) | Hw (nm) |
|---|---|---|---|---|---|---|
| 1 | B-435 nm | blue LED | 0.164 | 0.015 | 435 | 24.0 |
| 2 | B-450 nm | blue LED | 0.153 | 0.027 | 450 | 21.8 |
| 3 | BG-495 nm | cyan LED | 0.084 | 0.423 | 495 | 34.2 |
| 4 | PBG490 | cyan fluorescent powder | 0.081 | 0.428 | 495 | 33.2 |
| 5 | PG-GaAG | green fluorescent powder | 0.356 | 0.568 | 530 | 106.2 |
| 6 | PG-LuAG | green fluorescent powder | 0.378 | 0.566 | 535 | 107.6 |
| 7 | PY-YAG | yellow fluorescent powder | 0.449 | 0.533 | 555 | 117.3 |
| 8 | PR620 | red fluorescent powder | 0.620 | 0.379 | 615 | 81.5 |
| 9 | PR630 | red fluorescent powder | 0.638 | 0.362 | 630 | 94.2 |
| 10 | PR660 | red fluorescent powder | 0.710 | 0.289 | 660 | 18.3 |
| 11 | PR680 | red fluorescent powder | 0.720 | 0.280 | 680 | 7.0 |

Figure 2:
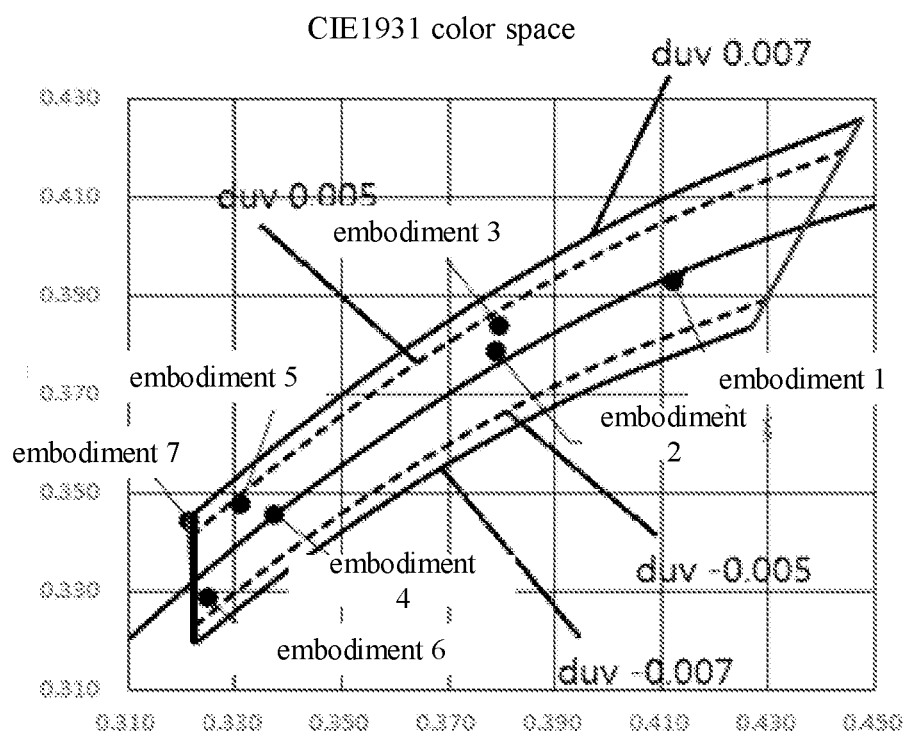
FIG. 2 is a CIE1931 chromatic coordinate diagram according to examples 1~7 of the present disclosure.
Figure 3:
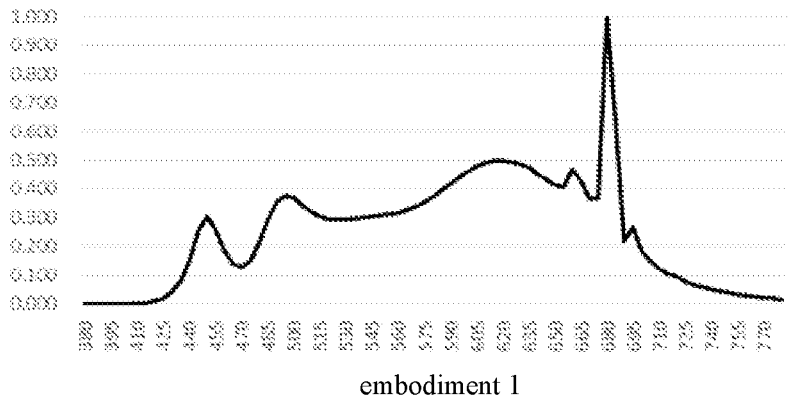
FIG. 3 is a spectrum of an emitted light of an example 1 in the present disclosure.
Figure 4:
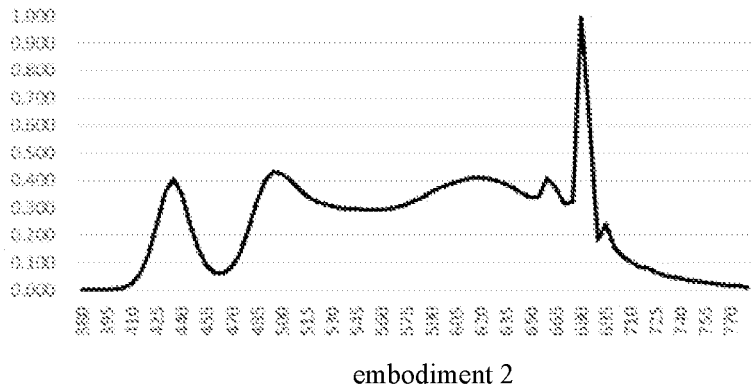
FIG. 4 is a spectrum of an emitted light of an example 2 in the present disclosure.
Figure 5:
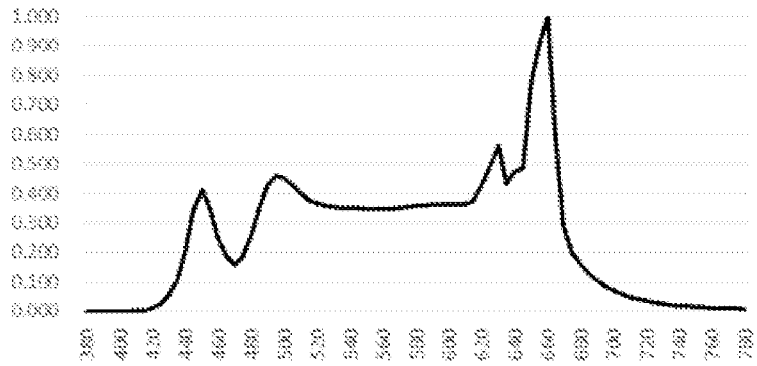
FIG. 5 is a spectrum of an emitted light of an example 3 in the present disclosure.
Figure 6:
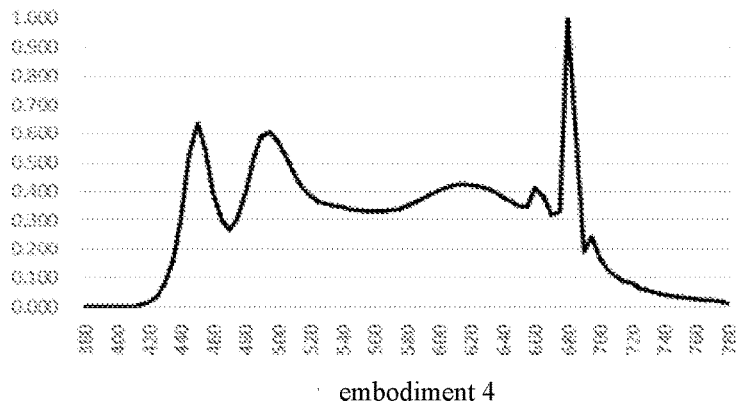
FIG. 6 is a spectrum of an emitted light of an example 4 in the present disclosure.
Figure 7:
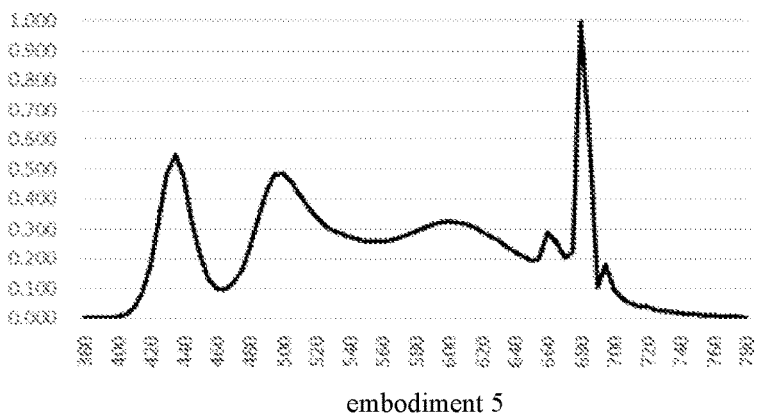
FIG. 7 is a spectrum of an emitted light of an example 5 in the present disclosure.
Figure 8:
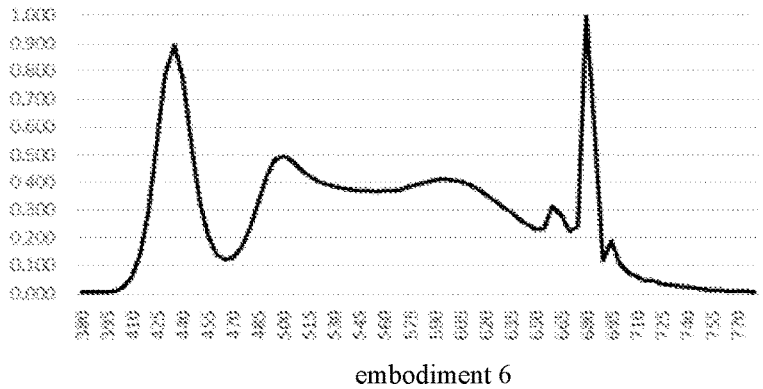
FIG. 8 is a spectrum of an emitted light of an example 6 in the present disclosure.
Figure 9:
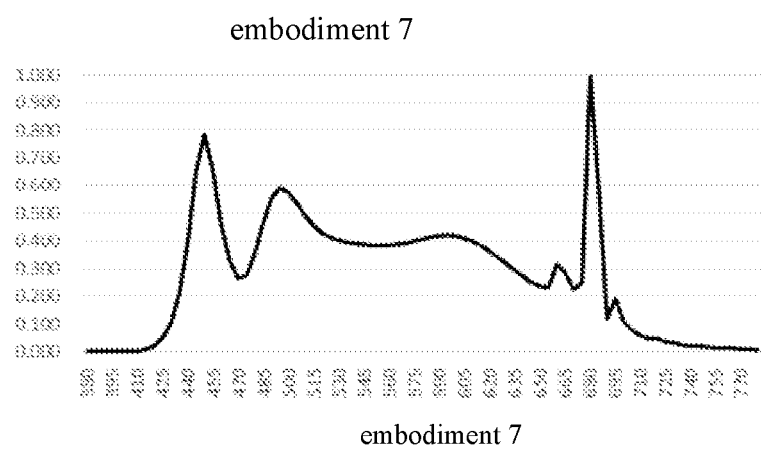
FIG. 9 is a spectrum of an emitted light of an example 7 in the present disclosure.

In Table 1, "x" and "y" represent the coordinate values of the light color of the light emitted by the LED/fluorescent powder on the x and y axes of the CIE1931 color coordinate system, "Peak" represents the peak wavelength of the LED/fluorescent powder, and "Hw" represents the half-width of the emission peak. The above values are the actual values of the LED/fluorescent powder used in the examples, and are not a limitation of the present disclosure. In actual production, due to the differences in purity and particle size of fluorescent powder, the peak wavelength and half-width may deviate slightly from the above values, and this deviation value is generally controlled within ±5 nm, and the solutions within this range should be considered to be equivalent to the above-mentioned fluorescent powder.

space, the distance from the blackbody locus BBL is duv=−0.007~0.007, and mainly duv=−0.005~0.005, as shown in FIG. 2. The yellow-green light generation portion 202 adopts a mixture of yellow fluorescent powder and green fluorescent powder, so that the color rendering property of the light source module L1 is better, and the CRI is above 85.

TABLE 2

| embodiments | blue light generation portion Blue_LED | cyan light generation portion | | yellow-green light generation portion | |
|---|---|---|---|---|---|
| | | BG_LED | cyan fluorescent powder | green fluorescent powder | yellow fluorescent powder |
| embodiment 1 | B-450 nm | | PBG490 | PG-GaAG | PY-YAG |
| embodiment 2 | B-435 nm | | PBG490 | PG-GaAG | PY-YAG |
| embodiment 3 | B-450 nm | | PBG490 | PG-LuAG | PY-YAG |
| embodiment 4 | B-450 nm | | PBG490 | PG-GaAG | PY-YAG |
| embodiment 5 | B-435 nm | BG-495 nm | | PG-GaAG | PY-YAG |
| embodiment 6 | B-435 nm | BG-495 nm | | PG-GaAG | PY-YAG |
| embodiment 7 | B-450 nm | | PBG490 | PG-GaAG | PY-YAG |

| embodiments | red light generation portion | |
|---|---|---|
| | second additional light emitter | first additional light emitter |
| | red fluorescent powder | red fluorescent powder |
| embodiment 1 | PR630 | PR680 |
| embodiment 2 | PR630 | PR680 |
| embodiment 3 | PR620 | PR660 |
| embodiment 4 | PR630 | PR680 |
| embodiment 5 | PR620 | PR680 |
| embodiment 6 | PR620 | PR680 |
| embodiment 7 | PR620 | PR680 |

According to the options of respective light generation portions in Table 2, seven examples of the light source module L1 of the present disclosure are formed by combing the light generation portions. The characteristic parameters of the emitted light of the examples are shown in Table 3, and the positions of the emitted light of the examples on the CIE1931 color coordinate system are shown in FIG. 2. Among them, "x" and "y" represent the coordinate values of the light color of the emitted light of the light source module of the examples on the x and y axes of the CIE1931 color coordinate system, "CCT" represents the color temperature, and "duv" represents the distance and direction of the color deviating from the Planckian locus in the color coordinate system, and "CRI" represents the color rendering index.

TABLE 3

| examples | x | y | CCT | duv | CRI |
|---|---|---|---|---|---|
| example 1 | 0.4124 | 0.3927 | 3364 | −0.0006 | 91.8 |
| example 2 | 0.3790 | 0.3784 | 4052 | 0.0012 | 92.0 |
| example 3 | 0.3798 | 0.3836 | 4067 | 0.0034 | 87.8 |
| example 4 | 0.3377 | 0.3453 | 5279 | −0.0001 | 86.0 |
| example 5 | 0.3313 | 0.3475 | 5550 | 0.0038 | 92.5 |
| example 6 | 0.3252 | 0.3284 | 5854 | −0.0032 | 91.3 |
| example 7 | 0.3218 | 0.3441 | 5976 | 0.0064 | 94.3 |

It can be seen from Table 3 that although the light source module L1 of the present disclosure increases the energy in the red light wave band and decreases the energy in the blue light wave band, the light color of the light source module L1 remains white color because of the addition of the cyan light generation portion 201; and in the CIE1931 color The purpose of relieving visual fatigue and preventing myopia required by the present disclosure is mainly achieved by controlling the energy proportions of different wave bands. Table 4 lists the spectral characteristics of the light source module L1 in the examples 1~7, and the spectrums of the emitted light of the light source module of the examples 1~7 are shown in FIG. 3-FIG. 9. Among them, the energy proportion of the blue light wave band is the proportion of the spectral radiation energy in the 430~470 nm wave band to the total radiation energy of the light source module L1 in the visible light wave band; the energy proportion of the cyan light wave band is the proportion of the spectral radiation energy in the 470~510 nm wave band to the total radiation energy of the light source module L1 in the visible light wave band; the energy proportion of the red light wave band is the proportion of the spectral radiation energy in the 600~780 nm wave band to the total radiation energy of the light source module L1 in the visible light wave band; and the energy proportion of the red light wave band 2 is the proportion of the spectral radiation energy in the 630~690 nm wave band to the total radiation energy of the light source module L in the visible light wave band. In addition, for the spectral intensity, we adopt a relative spectrum, that is, the highest intensity in the entire spectrum is 100%, and other positions are expressed by relative ratios to the highest peak. Therefore, the intensities of the peak wavelengths of the blue light, the cyan light and the secondary emission peak in the following table are the intensity ratios to the main emission peak.

TABLE 4

| embodiments | energy proportion of blue light wave band % | energy proportion of cyan light wave band % | energy proportion of red light wave band % | energy proportion of red light wave band 2% | peak wavelength of blue light (nm) | peak wavelength of cyan light (nm) |
|---|---|---|---|---|---|---|
| embodiment 1 | 7.8% | 12.6% | 52.0% | 30.5% | 450 | 495 |
| embodiment 2 | 8.8% | 14.4% | 46.5% | 27.9% | 435 | 495 |
| embodiment 3 | 9.5% | 15.5% | 44.8% | 30.3% | 450 | 495 |
| embodiment 4 | 13.2% | 18.7% | 41.0% | 24.4% | 450 | 495 |
| embodiment 5 | 13.5% | 17.7% | 36.7% | 22.7% | 435 | 508 |
| embodiment 6 | 17.2% | 14.5% | 33.5% | 19.8% | 435 | 508 |
| embodiment 7 | 16.2% | 18.6%' | 33.8% | 19.9% | 450 | 495 |

| embodiments | peak wavelength of main emission peak (nm) | peak wavelength of secondary emissions peak (nm) | spectral intensity of peak wavelength of blue light (%) | spectral intensity of peak wavelength of cyan light (%) | spectral intensity of peak wavelength of secondary emission peak (%) | spectral intensity of peak wavelength of main emission peak (%) |
|---|---|---|---|---|---|---|
| embodiment 1 | 628 | 680 | 50.0% | 37.8% | 49.9% | 100% |
| embodiment 2 | 628 | 680 | 48.5% | 43.3% | 41.0% | 100% |
| embodiment 3 | 628 | 680 | 41.2% | 46.6% | 77.2% | 100% |
| embodiment 4 | 615 | 680 | 63.7% | 60.8% | 42.3% | 100% |
| embodiment 5 | 600 | 680 | 54.9% | 48.7% | 32.5% | 100% |
| embodiment 6 | 600 | 680 | 89.5% | 49.6% | 41.1% | 100% |
| embodiment 7 | 600 | 680 | 78.1% | 59.1% | 41.0% | 100% |

As seen in Table 4, the spectra of the emitted light of the examples 1-7 all meet the energy distribution requirement proposed in the implementation mode. In subsequent tests, it was found that the light source module L1 of the examples 1-7, while achieving the lighting effect, relieves visual fatigue to a certain extent, and is expected to achieve the purpose of preventing myopia.

Figure 10:
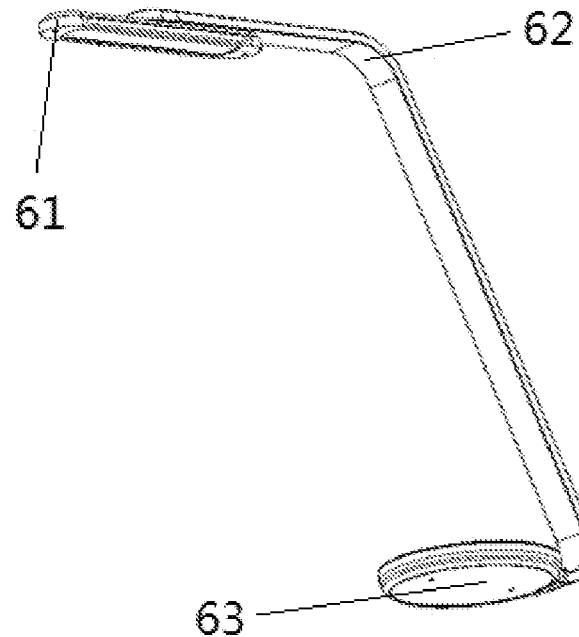
FIG. 10 is a schematic structural view of a lighting device according to examples of the present disclosure.

The above-mentioned light source module L1 is capable of being applied to various types of lamps. FIG. 10 shows a lighting device according to an example of the present disclosure, the lighting device for example is a table lamp in the present example, which includes a lamp head 61, a lamp pole 62, and a base 63, and the light source module L1 is provided at the lamp head. In other examples, the light source module L1 may be applied to various lamps such as pendant lamps, ceiling lamps, downlights, spotlights and the like, and the present disclosure is not limited thereto.

The purpose of the present disclosure is to solve the above-mentioned problems, and to provide a light source module that relieves visual fatigue, prevents myopia, and delays the development of myopia, and a lighting device including the light source module.

In order to realize the above-mentioned functions, the present disclosure adopts a technical solution of providing a light source module.

The light source module comprises: a blue light generation portion emitting a first color light with a peak wavelength in a blue light wave band of 430~470 nm; a cyan light generation portion emitting a second color light with a peak wavelength in a cyan light wave band of 470~510 nm; a yellow-green light generation portion emitting a third color light with a peak wavelength in a yellow-green light wave band of 510~600 nm; and a red light generation portion emitting a fourth color light with a peak wavelength in a red light wave band of 600~780 nm. The red light generation portion includes a first additional light emitter and a second additional light emitter, the first additional light emitter is configured to receive a part of light emitted by the blue light generation portion and convert the part of light into a light with a peak wavelength in 630~690 nm to form a main emission peak in the red light wave band, the second additional light emitter is configured to receive a part of light emitted by the blue light generation portion and convert the part of light into a light with a peak wavelength in 610~640 nm to form a secondary emission peak in the red light wave band, and a spectral intensity of the secondary emission peak is 30.0%~80.0% of a spectral intensity of the main emission peak; and the first color light, the second color light, the third color light and the fourth color light are mixed to form an emitted light of the light source module, the emitted light is a white light with a color temperature of 3000K~6000K, and in a CIE1931 color space, a distance between the emitted light and a blackbody locus BBL is duv=−0.007~0.007.

Preferably, a half-width of the main emission peak is not greater than 30.0 nm.

Preferably, the blue light generation portion emits the first color light with the peak wavelength in the blue light wave band of 440~460 nm; the cyan light generation portion emits the second color light with the peak wavelength in the cyan light wave band of 480~500 nm.

Preferably, a proportion of a spectral radiation energy of the light emitted by the red light generation portion in the red light wave band of 600~780 nm to a total radiation energy of the emitted light of the light source module in a visible light wave band of 380~780 nm is greater than or equal to 25.0%.

Preferably, a proportion of a spectral radiation energy of the light emitted by the red light generation portion in 630~690 nm to the total radiation energy of the emitted light of the light source module in the visible light wave band of 380~780 nm is 15.0%~50.0%.

Preferably, a proportion of a spectral radiation energy of the light emitted by the blue light generation portion in the blue light wave band of 430~470 nm to a total radiation energy of the emitted light of the light source module in a visible light wave band of 380~780 nm is 15.0%~50.0%.

Preferably, a proportion of a spectral radiation energy of the light emitted by the cyan light generation portion in the cyan light wave band of 470~510 nm to a total radiation energy of the emitted light of the light source module in a visible light wave band of 380~780 nm is 10.0%~30.0%.

Preferably, the proportion of the spectral radiation energy of the light emitted by the cyan light generation portion in the cyan light wave band of 470~510 nm to the total radiation energy of the emitted light of the light source module in the visible light wave band of 380~780 nm is 10.0%~20.0%.

Preferably, the light emitted by the blue light generation portion forms a first peak in the blue light wave band of 430~470 nm, and a spectral intensity of the first peak is 20.0%~100.0% of the spectral intensity of the main emission peak.

Preferably, the spectral intensity of the first peak is 30.0%~80.0% of the spectral intensity of the main emission peak.

Preferably, the light emitted by the cyan light generation portion forms a second peak in the cyan light wave band of 470~510 nm, and a spectral intensity of the second peak is 25.0%~100.0% of a spectral intensity of the main emission peak.

Preferably, the spectral intensity of the second peak is 35.0%~80.0% of the spectral intensity of the main emission peak.

Preferably, in the CIE1931 color space, the distance between the emitted light of the light source module and the blackbody locus BBL is duv=−0.005~0.005.

Preferably, the blue light generation portion is a blue light LED emitting light with a peak wavelength in 430~470 nm; and the first additional light emitter is a red fluorescent powder with a peak wavelength in 630~690 nm, the second additional light emitter is a red fluorescent powder with a peak wavelength in 610~640 nm.

Preferably, the first additional light emitter is a narrow-wave band fluorescent powder with a half-width less than or equal to 30.0 nm.

Preferably, the cyan light generation portion is a cyan light LED or a cyan fluorescent powder with a peak wavelength in 470~510 nm, and the yellow-green light generation portion includes a yellow fluorescent powder and/or a green fluorescent powder with a peak wavelength in 510~600 nm.

Preferably, the yellow-green light generation portion comprises at least one green fluorescent powder with a peak wavelength in 510~545 nm, and at least one yellow fluorescent powder with a peak wavelength in 510~545 nm.

The present disclosure further provides a lighting device comprising the light source module as described above.

The light source module provided by the present disclosure specially optimizes the spectral distribution for purpose of preventing myopia, and adds the narrow-wave band red fluorescent powder so as to change the energy distribution in a specific wave band of the red light wave band. Working, living and studying in the light environment provided by the light source module and the lighting device including the light source module of the present disclosure can relieve visual fatigue, thereby preventing myopia and delaying the development of myopia.

The above description of the examples of the present disclosure is for the purpose of illustration and description, and is not intended to exhaust the present disclosure or limit the present disclosure to the specific forms as disclosed. Many modifications and changes may be made, and these modifications and changes may be apparent to those skilled in the art and should be included within the scope of the present disclosure.

What is claimed is:

1. A light source module, comprising:
   a blue light LED emitting a first color light with a peak wavelength in a blue light wave band of 430~470 nm;
   a cyan light generation portion emitting a second color light with a peak wavelength in a cyan light wave band of 470~510 nm;
   a yellow-green light wavelength converter emitting a third color light with a peak wavelength in a yellow-green light wave band of 510~600 nm; and
   a red light wavelength converter emitting a fourth color light with a peak wavelength in a red light wave band of 600~780 nm, wherein
   the red light wavelength converter comprises a first red light wavelength converter and a second red light wavelength converter, the first red light wavelength converter is configured to receive a part of light emitted by the blue light LED and convert the part of light into a light with a peak wavelength in 630~690 nm to form a main emission peak in the red light wave band, the second red light wavelength converter is configured to receive a part of light emitted by the blue light LED and convert the part of light into a light with a peak wavelength in 610~640 nm to form a secondary emission peak in the red light wave band, and a spectral intensity of the secondary emission peak is 30.0%~80.0% of a spectral intensity of the main emission peak; and
   the first color light, the second color light, the third color light and the fourth color light are mixed to form an emitted light of the light source module, the emitted light is a white light with a color temperature of 3000K~6000K, and in a CIE1931 color space, a distance between the emitted light and a blackbody locus BBL is duv=−0.007~0.007.

2. The light source module according to claim 1, wherein a half-width of the main emission peak is not greater than 30.0 nm;
   the blue light LED emits the first color light with the peak wavelength in the blue light wave band of 440~460 nm;
   the cyan light generation portion emits the second color light with the peak wavelength in the cyan light wave band of 480~500 nm; and
   in the CIE1931 color space, the distance between the emitted light of the light source module and the blackbody locus BBL is duv=−0.005~0.005.

3. The light source module according to claim 2, wherein a proportion of a spectral radiation energy of the light emitted by the red light wavelength converter in the red light wave band of 600~780 nm to a total radiation energy of the emitted light of the light source module in a visible light wave band of 380~780 nm is greater than or equal to 25.0%.

4. The light source module according to claim 3, wherein a proportion of a spectral radiation energy of the light emitted by the red light wavelength converter in 630~690 nm to the total radiation energy of the emitted light of the light source module in the visible light wave band of 380~780 nm is 15.0%~50.0%.

5. The light source module according to claim 2, wherein a proportion of a spectral radiation energy of the light emitted by the blue light LED in the blue light wave band of 430~470 nm to a total radiation energy of the emitted light of the light source module in a visible light wave band of 380~780 nm is 15.0%~50.0%.

6. The light source module according to claim 2, wherein the light emitted by the blue light LED forms a first peak in the blue light wave band of 430~470 nm, and a spectral intensity of the first peak is 20.0%~100.0% of the spectral intensity of the main emission peak.

7. The light source module according to claim 6, wherein the spectral intensity of the first peak is 30.0%~80.0% of the spectral intensity of the main emission peak.

8. The light source module according to claim 2, wherein the light emitted by the cyan light generation portion forms a second peak in the cyan light wave band of 470~510 nm, and a spectral intensity of the second peak is 25.0%~100.0% of a spectral intensity of the main emission peak.

9. The light source module according to claim 8, wherein the spectral intensity of the second peak is 35.0%~80.0% of the spectral intensity of the main emission peak.

10. The light source module according to claim 1, wherein a proportion of a spectral radiation energy of the light emitted by the cyan light generation portion in the cyan light wave band of 470~510 nm to a total radiation energy of the emitted light of the light source module in a visible light wave band of 380~780 nm is 10.0%~30.0%.

11. The light source module according to claim 10, wherein the proportion of the spectral radiation energy of the light emitted by the cyan light generation portion in the cyan light wave band of 470~510 nm to the total radiation energy of the emitted light of the light source module in the visible light wave band of 380~780 nm is 10.0%~20.0%.

12. The light source module according to claim 1, wherein
the blue light LED is a blue light LED emitting light with a peak wavelength in 430~470 nm; and
the first red light wavelength converter is a red fluorescent powder with a peak wavelength in 6304690 nm, the second red light wavelength converter is a red fluorescent powder with a peak wavelength in 6104640 nm, and the first red light wavelength converter is a narrow-wave band fluorescent powder with a half-width less than or equal to 30.0 nm.

13. The light source module according to claim 12, wherein
the cyan light generation portion is a cyan light LED or a cyan fluorescent powder with a peak wavelength in 470~510 nm, and the yellow-green light wavelength converter includes a yellow fluorescent powder and/or a green fluorescent powder with a peak wavelength in 510~600 nm.

14. The light source module according to claim 13, wherein the yellow-green light wavelength converter comprises at least one green fluorescent powder with a peak wavelength in 510~545 nm, and at least one yellow fluorescent powder with a peak wavelength in 510~545 nm.

15. A lighting device, comprising a light source module wherein the light source module comprises:
a blue light LED emitting a first color light with a peak wavelength in a blue light wave band of 430~470 nm;
a cyan light generation portion emitting a second color light with a peak wavelength in a cyan light wave band of 470~510 nm;
a yellow-green light wavelength converter emitting a third color light with a peak wavelength in a yellow-green light wave band of 510~600 nm; and
a red light wavelength converter emitting a fourth color light with a peak wavelength in a red light wave band of 600~780 nm, wherein
the red light wavelength converter comprises a first red light wavelength converter and a second red light wavelength converter, the first red light wavelength converter is configured to receive a part of light emitted by the blue light LED and convert the part of light into a light with a peak wavelength in 6304690 nm to form a main emission peak in the red light wave band, the second red light wavelength converter is configured to receive a part of light emitted by the blue light LED and convert the part of light into a light with a peak wavelength in 6104640 nm to form a secondary emission peak in the red light wave band, and a spectral intensity of the secondary emission peak is 30.0%~80.0% of a spectral intensity of the main emission peak; and
the first color light, the second color light, the third color light and the fourth color light are mixed to form an emitted light of the light source module, the emitted light is a white light with a color temperature of 3000K~6000K, and in a CIE1931 color space, a distance between the emitted light and a blackbody locus BBL is duv=−0.007~0.007.

* * * * *